(12) United States Patent
Turevsky et al.

(10) Patent No.: US 11,223,316 B2
(45) Date of Patent: Jan. 11, 2022

(54) METHOD AND APPARATUS FOR CONTROLLING THREE-PHASE ELECTRIC MOTOR

(71) Applicant: Power Drive Efficiency Ltd., London (GB)

(72) Inventors: Igor Alexander Turevsky, Fourqueux (FR); Moshe Haim Naiman, Jerusalem (IL); Arthur Naiman, Jerusalem (IL)

(73) Assignee: Power Drive Efficiency Ltd., London (GB)

( * ) Notice: Subject to any disclaimer, the term of this patent is extended or adjusted under 35 U.S.C. 154(b) by 528 days.

(21) Appl. No.: 16/091,946

(22) PCT Filed: Mar. 31, 2017

(86) PCT No.: PCT/GB2017/000052
§ 371 (c)(1),
(2) Date: Oct. 25, 2018

(87) PCT Pub. No.: WO2017/174957
PCT Pub. Date: Oct. 12, 2017

(65) Prior Publication Data
US 2019/0131912 A1 May 2, 2019

(51) Int. Cl.
*H02P 25/00* (2006.01)
*H02P 29/40* (2016.01)
(Continued)

(52) U.S. Cl.
CPC .............. *H02P 29/40* (2016.02); *G01R 21/06* (2013.01); *G01R 31/34* (2013.01); *H02P 1/32* (2013.01);
(Continued)

(58) Field of Classification Search
CPC .......... H02P 29/40; H02P 1/32; H02P 25/184; H02P 2207/01; G01R 31/34; G01R 21/06
(Continued)

(56) References Cited

U.S. PATENT DOCUMENTS

| 4,434,394 A | 2/1984 | Kellogg et al. |
| 4,764,720 A | 8/1988 | Nystrom |

(Continued)

FOREIGN PATENT DOCUMENTS

| EP | 1492142 A2 | 12/2004 |
| JP | 2002058108 A | 2/2002 |
| WO | 2012163433 A2 | 12/2012 |

OTHER PUBLICATIONS

International Searching Authority, "International Search Report and Written Opinion from PCT Application No. PCT/GB2017/000052 dated Dec. 19, 2017", from Foreign Counterpart to GB Application No. 1606163.2, dated Dec. 19, 2017, pp. 1-23, Published: EP.

(Continued)

*Primary Examiner* — Kawing Chan
*Assistant Examiner* — Gabriel Agared
(74) *Attorney, Agent, or Firm* — Fogg & Powers LLC

(57) ABSTRACT

Methods and control apparatus for operating a three-phase electric motor are described, in which the motor windings are switched between Star and Delta connections depending on torque requirements, and in which the motor windings are switched to a braking mode when braking torque is required. The electromagnetic torque of the motor is monitored, and a command to switch from Star to Delta is given when the electromagnetic torque rises to reach or exceed a threshold.

12 Claims, 9 Drawing Sheets

(51) Int. Cl.
*H02P 25/18* (2006.01)
*H02P 1/32* (2006.01)
*G01R 31/34* (2020.01)
*G01R 21/06* (2006.01)

(52) U.S. Cl.
CPC ........ *H02P 25/184* (2013.01); *H02P 2207/01* (2013.01)

(58) Field of Classification Search
USPC ........................................................ 318/771
See application file for complete search history.

(56) References Cited

U.S. PATENT DOCUMENTS

| | | | |
|---|---|---|---|
| 5,003,252 A | 3/1991 | Nystrom | |
| 8,207,699 B2 | 6/2012 | Naiman | |
| 2002/0180296 A1* | 12/2002 | Nickoladze | H02K 17/36 310/166 |
| 2005/0013085 A1* | 1/2005 | Kinsella | H01H 9/563 361/162 |
| 2008/0150471 A1* | 6/2008 | Unsworth | H02P 1/26 318/771 |
| 2011/0006720 A1* | 1/2011 | Naiman | H02P 1/26 318/771 |
| 2012/0223663 A1 | 9/2012 | Dietl et al. | |
| 2014/0070754 A1 | 3/2014 | Kouvo et al. | |
| 2014/0306583 A1* | 10/2014 | Moller | H02H 7/06 310/68 C |
| 2015/0180377 A1* | 6/2015 | Hua | H02P 23/14 318/778 |
| 2016/0133415 A1* | 5/2016 | Bock | H01H 50/86 361/187 |
| 2016/0134205 A1* | 5/2016 | Bock | H01H 9/563 318/778 |

OTHER PUBLICATIONS

UK Intellectual Property Office, "Search Report under Section 17(5) from GB Application No. GB 1606163.2 dated Oct. 20, 2016", from Foreign Counterpart to PCT Application No. PCT/GB2017/000052, dated Oct. 20, 16, pp. 1-5, Published: UK.

UK Intellectual Property Office, "Search Report under Section 17(6) from GB Application No. 1606163.2 dated Jan. 20, 2017", from Foreign Counterpart to PCT Application No. PCT/GB2017/000052, dated Jan. 20, 2017, pp. 1-3, Published: UK.

* cited by examiner

METHOD AND APPARATUS FOR CONTROLLING THREE-PHASE ELECTRIC MOTOR

FIELD OF THE INVENTION

The present invention concerns the control of three-phase alternating current motors. Particularly, the invention concerns an apparatus and method for controlling a three-phase alternating current motor, in particular an asynchronous motor, to drive a mechanical device or mechanism which does not require precise speed control. The invention has particular utility in the field of electric-motor driven devices which have frequent start-up and braking cycles, and which have variable loading. Examples of such machines are mixers, cranes, elevators, centrifugal casting machines and metal fabricating machines. The invention also has utility in the field of continuously operating mechanisms which do not require precise speed control, examples of which are pumps, fans, compressors, conveyors, escalators and ventilation equipment.

BACKGROUND

Three-phase AC motors for driving industrial machines or equipment typically have a three motor windings in the stator, and operate on a three-phase electricity supply. The motor windings are arranged symmetrically and are connected to the three phase supply either in a Delta ($\Delta$) configuration or a Star (Y) configuration. The Star or "Y" configuration is also known as a "Wye" configuration. Each of the motor windings has a first end and a second end. In the Delta ($\Delta$) configuration, the first end of each winding is connected to the second end of the next winding so that the three windings are connected in a triangle, with the three phases of the supply connected at respective apices of the triangle. In the Star (Y) configuration, the first ends of all of the three windings are connected together, and each respective second end is connected to one of the phases of the three-phase supply.

To improve the startup and the energy performance under load, three-phase motors are often provided with control circuitry able to switch their windings from Star to Delta configurations and vice versa.

Each motor winding may comprise one or more coils connected in series, the coils being distributed round the stator so as to produce a rotating magnetic field when connected to the three-phase supply. When there is no mechanical load on the motor, the rotor of the motor rotates at the same speed as the rotating magnetic field. The frequency of the mains supply thus defines the design speed of the synchronous motor. When the motor is driving a load, the speed of rotation of the rotor is slightly slower than that of the rotating magnetic field, this phenomenon being known as "slip".

A motor connected in the Delta ($\Delta$) configuration has an increased current through the motor windings as compared to a motor connected in the Star (Y) configuration, and thus the Star configuration is typically used for starting a direct line connected motor so as to avoid power source overloads. When the motor has been started and is running at or near its design speed, the windings are switched to a Delta configuration, so that the motor can run at high power outputs. The transition in either direction between Star and Delta may be made either in an "open transition" in which power is momentarily removed from the motor and the connections of the windings are switched, or in a "closed transition" in which the windings are switched while power remains connected. In such a "closed transition", there is usually a power inrush into the motor during the transition process.

Speed Control

To control the speed of a three-phase motor, various control circuits exist to convert the frequency of the mains supply to a lower frequency within a predetermined range, and apply this converted frequency to the motor terminals to vary the design speed of the motor. The actual speed of rotation will depend on the mechanical load, and hence the amount of "slip", and thus by adjusting the frequency in accordance with the actual rotation speed, a predetermined rotation speed may within a certain range be reliably achieved. There is a considerable amount of literature available describing these variable-frequency devices (VFD), which can be broadly classified as having either natural, forced or mixed commutation.

The primary applications of VFD controllers in driving three-phase motors is their use to provide accurate speed control, to provide constant power consumption in the event of load changes, and to provide fluency and continuity of rotation by limiting jerkiness in the running of the motor.

A substantial drawback, however, with VFD controllers is their high cost and large size, particularly in high-power motors over 100 kW. This is because the power components of the VFD are bulky and require multiple energy conversions to produce the output voltage. The majority of current VFD controllers include pulse width modulation (PWM) management and control systems to minimise the influence of the VFD controller on the supply line and these PWM systems require high-frequency filters and expensive gate elements such as RGBT transistors. Furthermore, if the VFD controller is not provided with systems to synchronise the motor with the supply network, then bypassing the controller may result in strong current surges which may lead to motor failure.

Cycloconverters are often used to convert an input AC waveform to an output AC waveform of a lower frequency, without requiring an intermediate DC conversion. Cycloconverters operate by synthesizing the required output AC waveform from segments of the input AC waveform. Cycloconverters are most often found in very high power output systems such as variable frequency drives exhibiting ratings of several megawatts. In installations that require constant deep motor rotation frequency control from zero to a nominal value, utilization of frequency converters in currently considered as having no practical alternative.

There are, however, many applications of electric motors to drive machinery which do not require the motor speed to be accurately controlled by precise rotation frequency control. In such applications, opportunities exist to reduce power consumption by increasing efficiency of their start-up and braking modes, occasional regulation of their rotation frequency and ways to cut power consumption during underload operation mode at the intended (nominal) rotation frequency, which is almost impossible to achieve by making use of standard frequency converters. Therefore, their utilization of the above techniques in many electric drives, such as drives used in mixers, cranes, elevators, centrifugal casting machines, metal fabricating machines, submersible pumps, water supply centrifugal pumps, fans, compressors, conveyors, escalators, HVAC and the like, is both economically and technically unwarranted.

Energy Saving by Start-Up Systems

Another effective way of reducing the consumption of electric power is to shut down an electric motor when it is not required. However, frequent stopping and starting of a motor can degrade the motor windings and their insulation. So-called "soft starters" are used to prolong the mechanical service life of an electric drive which is subject to frequent startups and shutdowns. Some soft starters are equipped with voltage adapters to balance the changing static load torque at the shaft during start-up.

These soft starter systems reduce the voltage applied to the motor, in order to ensure the motor startup current is kept to about 2 to 4 times the nominal state current and correspondingly decreases the startup torque. This leads to a sharp decrease in the electrical stress on the windings and consequently reduces or avoids mechanical degradation of their insulation. Furthermore, lower startup torques reduce damage to the drive's mechanical parts by reducing impulsive loads.

However, the traditional soft startup system has a number of shortcomings, the most essential of which are as follows:
1. Considerable energy release in the motor during its startup. The motor energy in the soft start mode is about always higher than in the direct drive mode. Furthermore, the cooling conditions of a self-ventilated motor drastically deteriorate at lower rotation frequencies, so that higher start-up currents are generating heat in the motor at a time when the cooling system of the motor is least able to deal with it.
2. Lack of efficient braking mode. When the motor rotation frequency is lower than synchronous, it can only develop a driving torque. Braking can be achieved by the static load or by a mechanical brake. Therefore, by using traditional starting devices can only increase braking time in compared to the free stopway by means of partial compensation of the static load torque, but not cut it.
3. Not practicable power saving. The reason is that reducing only the voltage amplitude (without changing its frequency) supplied to the motor by controlling the opening angle of a soft starter's thyristors leads to a significant increase in losses in the motor due to the distortion of the shape of the voltage. Therefore, a small energy savings can be achieved only when the load on the motor shaft is close to idling.

Energy-Saving by Star to Delta Switching

As referred to above, switching the connection of the motor windings from Star to Delta or vice versa is an effective way of reducing energy consumption, by ensuring that the motor windings are connected in Star during start-up to avoid power source overloads, and are switched to Delta connection when the motor is operating at speed and is required to produce high torque. The motor is switched back from Delta to Star when the load decreases, and back to Delta when the load again increases.

In U.S. Pat. No. 8,207,699, the present inventors describe a method for reducing energy consumption in a three-phase motor by switching the motor from Star to Delta connection on the basis of measurements of the motor speed, the current passing through two windings of the motor, and the static load torque of the motor. Monitoring these parameters and switching the connections when predetermined combinations of the parameters are met can however lead to switching operations being undertaken at points in the AC voltage cycle which give rise to large inrush currents which may adversely affect the motor.

The Present Invention

The present invention addresses the technical problem of reducing energy consumption, particularly in three-phase electric motor drives which do not require accurate speed control but which operate under varying load, by providing improved apparatus and methods of switching windings of induction motors from "STAR" to "DELTA" and vice versa. The present invention provides a highly efficient, reliable, simple to use control apparatus for an AC electric motor, which is both low in cost and small in size. A method of controlling the switching of windings in an AC electric motor is also provided.

The present invention addresses this technical problem by:
1. Improving the energy efficiency of switching the motor windings from Star to Delta or vice versa, by selecting a particular instant in the three-phase cycle to switch the windings, based on measurements of motor parameters;
2. Reduction or elimination of inrush currents caused by switching the windings;
3. Providing a simple method for calculating important motor energy parameters such as the electromagnetic torque Tem and the self-induction EMF, as a basis for timing the switching of the motor windings; and
4. Providing an effective motor braking mode without changing the power structure of the system, by the use of new principles of the drive control in both the dynamic and steady state operation modes.

The control system of the present invention significantly increases the reliability and efficiency of an induction motor at little extra cost to its control system, and is widely applicable to AC motor drives where precise speed control is not essential.

An important feature of the present method for AC motor control is that the motor windings are switched at an accurately calculated instant during the AC cycle, on the basis of measurements of the EMF, the electromagnetic motor torque and static load torque on the motor shaft.

A first aspect of the present invention provides methods of controlling the operation of a three-phase motor to switch between Star and Delta configurations, as defined in claims 1 and 13.

A second aspect of the invention provides a controller for controlling the operation of a three-phase motor, as defined in claim 7.

A third aspect of the invention provides a method of driving a load by means of a three-phase electric motor, as defined in claim 11.

A fourth aspect of the present invention provides a method of determining the instantaneous power developed by a three-phase motor, as defined in claim 12.

A fifth aspect of the present invention provides an apparatus and methods for providing braking of a three-phase motor, as defined in claims 15 to 19.

The motor control unit is arranged to connect the windings of the alternating current motor in either the Star or Delta configuration in response to a predetermined combination of energy saving drive conditions. Unlike all known methods of switching the motor windings, in the present invention these conditions are determined on the basis of a value of the motor's electromagnetic torque (Tem) as a function of the rotational frequency (n) and static load on the shaft. By this means the maximum possible economic effect in the electric drive with a variable load is achieved over time. In more detail the proposed method is discussed below.

The present invention allows a large number of stop-start procedures to be carried out within a short period of time and has no supply network synchronization problems. It provides a highly efficient process control in processes requiring that a process parameter, for example pressure or mass flow of a gas or liquid, be maintained substantially constant. Such control is a typical requirement for compressors and pumping stations equipped with multiple motors operating in parallel on a single power supply network. It is a further feature of the present invention that the method may be successfully used in multi-unit installations where one of the units is equipped with an expensive control system to provide smooth control of a process parameter parameters (for example, a unit having a VFD controller), while the remaining units are equipped with a control device implementing the proposed method of motor control for switching between Delta and Star connection.

DESCRIPTION OF THE DRAWINGS

Embodiments of the invention will now be described in detail with reference to the accompanying drawings, in which.

OVERVIEW

Figure 1:
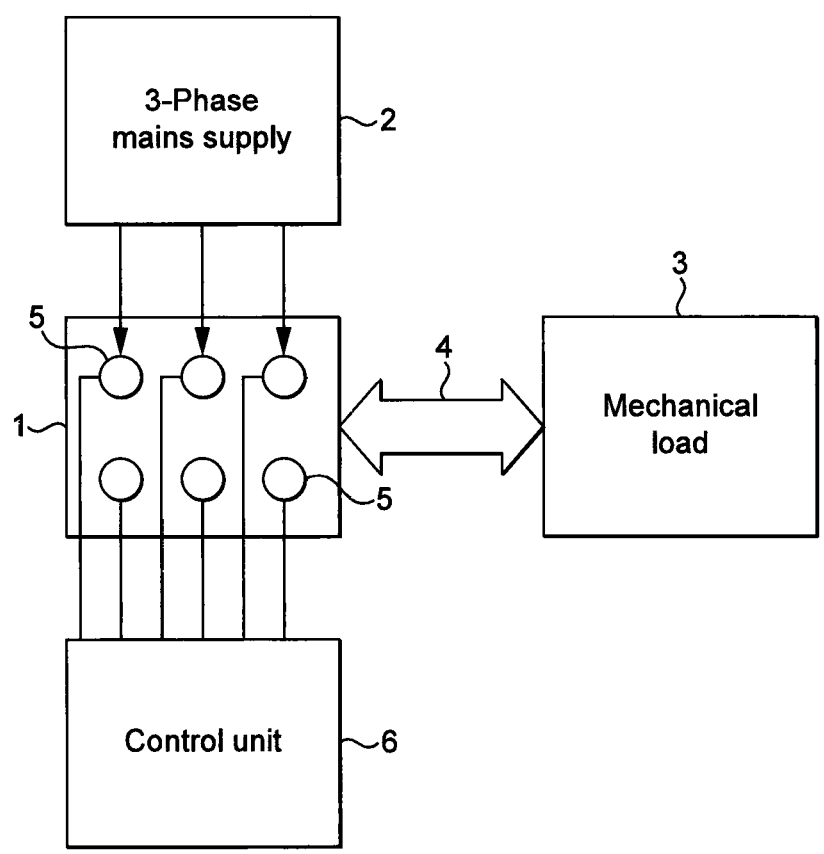
FIG. 1 is a schematic view showing a three-phase mains supply powering a motor linked to a mechanical load, and a control unit.

Referring now to the drawings, FIG. 1 schematically illustrates a three-phase motor 1 powered from a three-phase mains supply 2 and mechanically connected to a load 3. The rotor of the motor 1 is connected via a transmission 4 to the mechanical load 3.

In the case of a rotating load, the inertia of the load 3 may require high torque from the motor 1 during an acceleration phase, but once the load is up to its rotation speed then the torque requirement from the motor may decrease. When the load is decelerated, the inertia of the load will continue to "drive" the motor during this deceleration phase.

The three-phase motor 1 has three stator windings, and six terminals 5 on the motor body each connected to a respective end of one of the stator windings. In the illustrated embodiment, three of the terminals 5 are connected to respective phases of the three-phase mains supply, and all of the terminals 5 are connected to the control unit 6. Within the control unit 6, switchable connections are made between the terminals 5 so as to connect the three stator windings of the motor 3 in either a "Star" configuration or a "Delta" configurations.

The motor is started, usually in Star configuration, and accelerates the load 3 to a nominal working speed. During operation of the motor 1 to drive the load 3, the torque produced by the motor is continuously monitored and when the torque requirement falls below a predetermined first threshold value, the motor windings are switched to Star configuration to reduce power consumption. When the torque requirement increases to a second threshold value, which may be the same as or higher than the first threshold value, then the motor windings are switched from Star to Delta configuration, so that the motor may produce the increased torque at a lower motor current.

A feature of the invention is that, while the motor is in operation, the control unit monitors the phase difference between the mains supply voltage and the phase EMF of the motor, and permits switching from Star to Delta or vice versa only when these two vectors are substantially aligned in phase. It is this alignment which reduces inrush currents into the motor when the windings are switched from Star to Delta or vice versa.

Motor Control

The control unit 6 continuously monitors the voltage supplied in each phase of the three-phase supply, and also continuously monitors the voltage and current flowing in each of the motor windings. At discrete points during each cycle of the supply voltage, simultaneous measurements of the phase currents ia, ib and ic and the phase voltages va, vb and vc are taken, and on the basis of selected ones of these measurements a value for the instantaneous electromagnetic power Pem of the motor is calculated. On the basis of the calculated value of Pem, averaged over one or more cycles, and taking into account the electrical characteristics of the motor and optionally also the mechanical characteristics of the load, the control unit 6 switches the motor between the Star and Delta configurations in order that the motor should consume a minimum amount of power.

Figure 2:
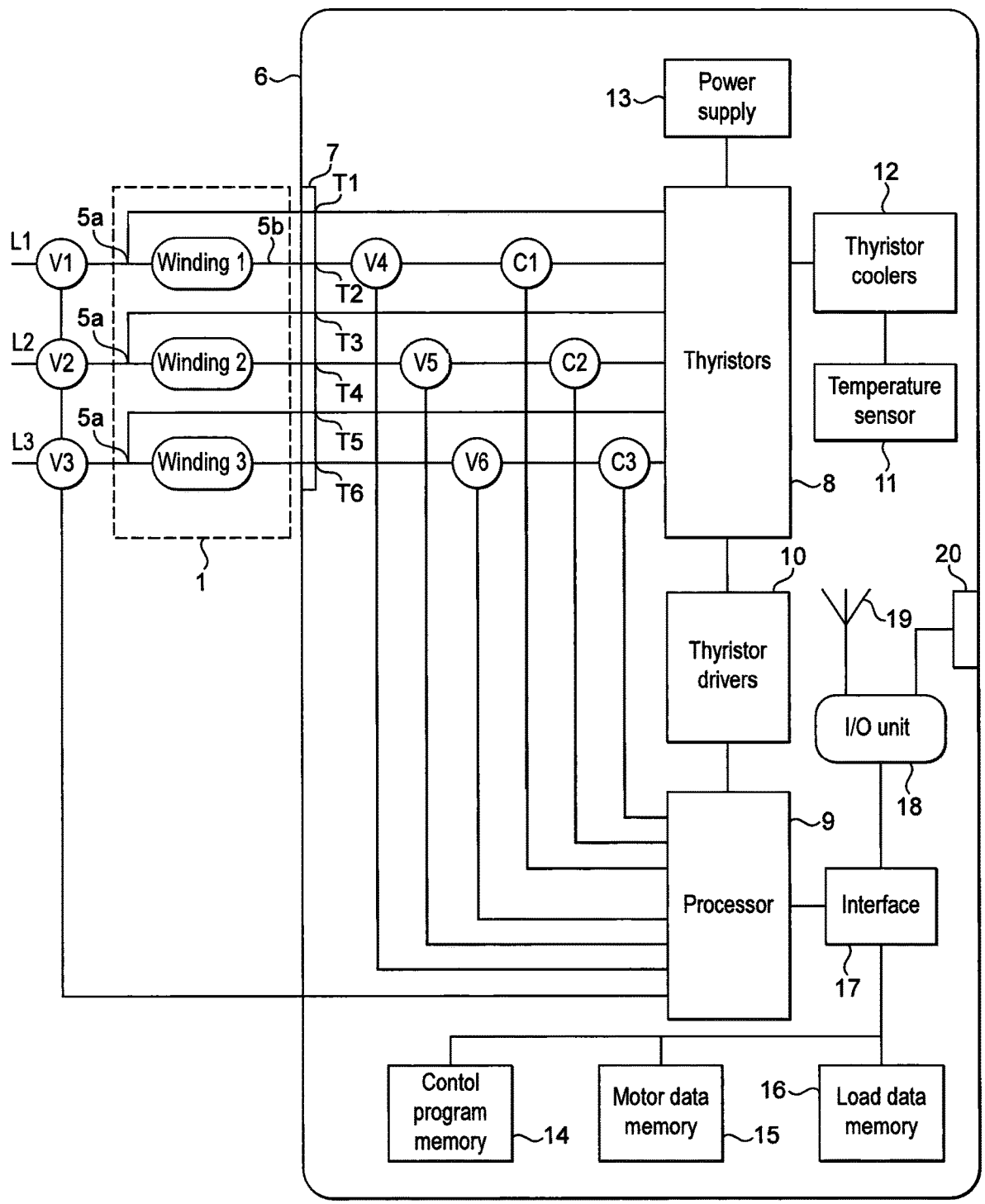
FIG. 2 is a schematic view of the control unit of FIG. 1.

An embodiment of the control unit 6 is shown in greater detail in FIG. 2. In this embodiment, a three-phase supply is provided through three supply lines L1, L2 and L3 to the three-phase motor 1. Voltage measurement devices V1, V2 and V3 are connected to respective ones of the three supply lines, to monitor the line voltages. Each of the three supply lines L1, L2 and L3 is connected to a respective input terminal 5a at one end of one of the motor windings.

The control unit 6 includes a terminal board 7 having six terminals T1 to T6. Terminal T1 is connected to the input terminal 5a of the first winding (winding 1) of the motor. Terminal T2 is connected to the output terminal 5b of the first winding of the motor. Likewise, terminals T3 and T4 are connected to the respective ends of winding 2 of the motor, and terminals T5 and T6 are connected to the respective ends of winding 3 of the motor 1.

Terminals T1, T3 and T5 are directly connected to a bank of thyristors 8, while Terminals T2, T4 and T6 are connected to the bank of thyristors 8 each through a further voltage measurement device V4, V5, V6 and a current measuring device C1, C2, C3. The voltage measurement devices V4, V5 and V6 respectively measure the phase voltages va, vb and vc in the a, b and c phases, while the current measuring devices C1, C2 and C3 measure the respective phase currents ia, ib and is in the a, b and c phases. Outputs from the voltage measuring devices V1 to V6 and C1 to C3 are fed to the processor 9 of the control unit 6.

The bank of thyristors 8 provides connections between the terminals 5a and 5b of the windings, to enable the windings to be connected either in Star or Delta configuration. The thyristors are controlled by the processor through a thyristor driver circuit 10, which sends signals to switch the thyristors to achieve either Star or Delta connection between the motor windings.

The controller 6 further includes a temperature sensor 11, a cooling arrangement 12 to cool the thyristors, and a power supply 13 to provide power to drive the thyristors, the processor and the associated circuitry.

The control unit includes a control program memory 14 which stores details of the control algorithm, a motor data memory 15 which stores data relating to the characteristics of the motor, and a load data memory 16 which stores data relating to the mechanical characteristics of the load being driven by the motor. The three memories 14, 15 and 16 are connected to the processor via an interface 17, which also connects to an input/output unit 18. The input/output unit may receive and transmit information wirelessly via an antenna 19, or may transmit and receive data via a connection port 20 such as a USB or other suitable connector. Information received from the input/output unit 18 may be stored in the control program memory 14, the motor data memory 15 and/or the load data memory 16. Information stored in the control program memory 14, the motor data memory 15 and/or the load data memory 16 may likewise be read and retrieved via the input/output unit 18.

Figure 3:
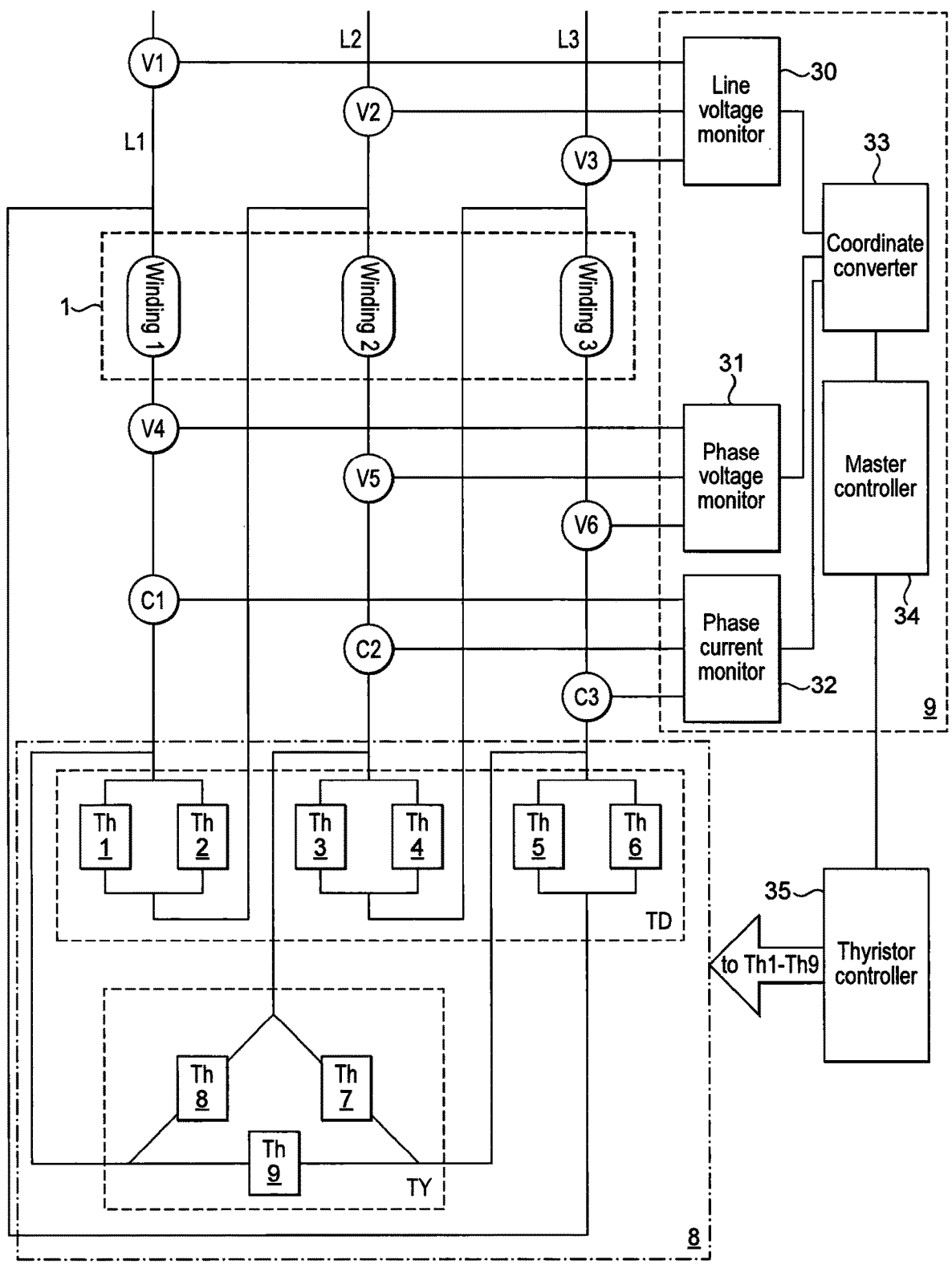
FIG. 3 is a schematic view showing the constituents of the control unit, comprising elements for measuring of the mains supply voltage and the instantaneous values of motor's phase voltage and phase current.

FIG. 3 illustrates the arrangement of the thyristors Th1 to Th9 in the bank of thyristors 8. The thyristors are divided into two groups, designated in FIG. 3 as groups TD and TY. Thyristors Th1 to Th6 form group TD, which comprises three pairs of antiparallel or oppositely-connected thyristors Th1 and Th2, Th3 and Th4, and Th5 and Th6. Thyristors Th7 to Th9 are connected in cyclic fashion to form group TY. When the thyristors of group TD are conducting and the thyristors of group TY are turned off and thus do not conduct, then the windings of the motor are connected in Delta formation. Likewise, when the thyristors of group TY are conducting and the thyristors of group TD are turned off and thus do not conduct, then the windings of the motor are connected in Star formation.

FIG. 3 also illustrates in greater detail elements of the processor 9. A line voltage monitor 30 receives analogue voltage signals from the three voltage measuring devices V1, V2, V3, representing the instantaneous values of voltage in each of the three supply lines L1 L2 and L3.

A phase voltage monitor 31 receives analogue voltage signals from the three voltage measuring devices V4, V5, V6 which provide continuous indications of the voltage at each of the windings of the motor.

A phase current monitor 32 receives analogue current signals from the three current measuring devices C1 C2 and C3, which provide continuous indications of the current flowing in each of the windings of the motor.

The analogue values of the respective voltages and currents are simultaneously sampled at intervals to produce a set of instantaneous values for the currents and voltages, and these instantaneous values are fed from the line voltage monitor 30, the phase voltage monitor 31 and the phase current monitor 32 to a coordinate converter 33.

Figure 4A:
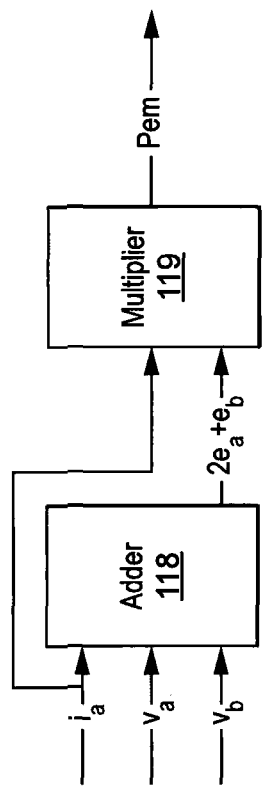
FIG. 4a is a schematic flow chart illustrating the calculation of an instantaneous value of phase electromagnetic power (Pem) for one phase.

The operation of the coordinate converter 33 will now be described with reference to FIGS. 4a and 4b. FIG. 4a schematically illustrates the calculation of the electromagnetic power Pem from instantaneous values of voltage and current from two of the three phases. To appreciate the simplicity of the calculation, and understanding of the wave form of the motor winding current during each cycle of the supply frequency will now be explained, with reference to FIG. 6.

Figure 6:
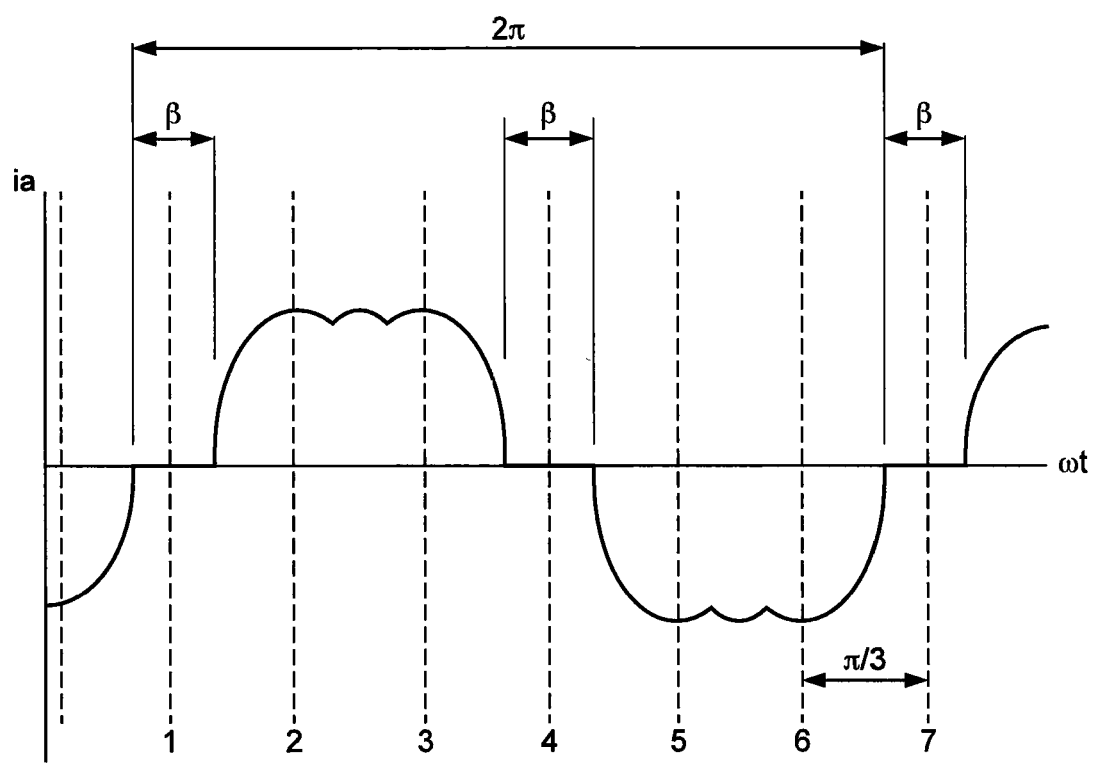
FIG. 6 illustrates an example of the phase current of one phase of the motor controlled by a thyristor (semiconductor) regulator.

FIG. 6 illustrates the relationship between the phase current is and time in one of the motor windings (phase a) of a motor controlled by a thyristor regulator. When the thyristors of the regulator are fully open, the motor phase current is close to sinusoidal. When the thyristors of the regulator are periodically opened to slow down the motor, the phase current adopts a form similar to the form shown in FIG. 6. Over the supply cycle interval $2\pi$ the current in the motor winding is initially zero for a short period of time $\beta$, during which the derivative of the current is also zero. The current then rises in a modified sinusoidal wave form which is the result of opening the thyristors of the regulator intermittently to control motor speed. This next part of the waveform has three local maxima, separated by two singularities, before returning to zero for a further interval $\beta$. The voltage then has a negative half-cycle mirroring the form of the positive half cycle (with three local minima), before returning again to zero.

The broken vertical lines numbered 1 to 7 arranged at intervals of $\pi/3$ break up the cycle into six equal parts. Lines 1 and 4 correspond to instants when the phase current ia is zero and the derivative of the phase current dia/dt is also zero, while lines 2 and 3 correspond to instants when the phase current ia has a positive value, and the derivative of the phase current dia/dt is zero. Lines 5 and 6 correspond to instants when the phase current ia has a negative value, and the derivative of the phase current dia/dt is zero at one of the local minima.

The waveforms for the phase current against time in the other two phase windings of the motor are similar in form, but each phase is displaced by $2\pi/3$ relative to the other phases. Thus, the current in phase b is zero (corresponding to dotted line 1) when the current in phase a is at a local maximum (i.e di/dt is zero) at dotted line 3. At this same instant the current in phase c is at a local minimum position corresponding to dotted line 5 (again di/dt is zero).

Thus, during each cycle of the mains supply, there are six instants when simultaneously the current in one of the phases is zero, the derivative of the current in that phase is also zero, and the derivative of the currents in the other two phases are zero. These six instants correspond to the instants when each of the three phase currents ia, ib and ic is at the positions of dotted lines 1 and 5 in the diagram of FIG. 6.

When the thyristors of the regulator are fully open to develop maximum motor power, the waveform of the phase current is approximately sinusoidal. This means that there are two points at which the phase current is zero, and two points at which the derivative of the phase current is zero during each cycle of the supply voltage.

Calculation of Instantaneous Value of Electromagnetic Power Pem

The calculation of the Electromagnetic power Pem (in the air gap of the motor) may will now be explained. The electromagnetic power Pem may be expressed as:

$$Pem = Tem \times \omega o \qquad (1)$$

where
ωo is the angular frequency of the network; and
Tem is the electromagnetic torque.
Electromagnetic power Pem may also be calculated as a scalar product of the vectors EMF (e) and current (i) of the stator, using the equation:

$$Pem = ex \cdot iy + ey \cdot ix \qquad (2)$$

where:
ex and ey are the orthogonal components of the EMF in the stator;
i1y and i1x are the orthogonal components of the stator current.

Using the conversion phase currents and EMF in the form:

$$i1x=ia;$$

$$i1y=-(ib-ic)/\sqrt{3};$$

$$ex=ea; \text{ and}$$

$$ey=-(eb-ec)/\sqrt{3},$$

Where:
ia is the phase current in motor winding a;
ib is the phase current in motor winding b;
ic is the phase current in motor winding c;
ea is the Phase EMF in phase a;
eb is the Phase EMF in phase b; and
ec is the Phase EMF in phase c.

By deleting the variables in one of the phases (e.g., phase "c"), the equation (2) can be reduced to:

$$Pem=(2ea+eb)ia+(2eb+ea)ib \quad (4)$$

Phase EMF ea eb and ec for each of the three phases are defined as follows:

$$ea=va-r1ia-L1 dia/dt \quad (5a)$$

$$eb=vb-r1ib-L1 dib/dt \quad (5b)$$

$$ec=vc-r1ic-L1 dic/dt \quad (5c)$$

where:
va is the phase of voltage in phase a;
vb is the phase of voltage in phase b;
vc is the phase of voltage in phase c;
r1 is the resistance of the stator; and
L1 is the leakage inductance of the stator windings.

To simplify the calculations, the phase electromotive force and the electromagnetic torque of the motor can be calculated on the basis of voltage and current measurements made at the particular points in the voltage cycle where one of the phase currents is zero and the derivatives of that phase current and one other phase current are zero or close to zero. For example, if an instant is chosen when the phase current in phase b is zero, the derivative of the phase current in phase b is zero, and the derivative of the phase current in phase a is zero, i.e. ib=0, dib/dt=0, and dia dt=0, then equations (5a) and (5b) simplify to:

$$ea=va-r1ia; \quad (6a)$$

$$eb=vb \quad (6b)$$

and equation (4) simplifies to:

$$Pem=(2ea+eb)ia \quad (6c)$$

These instants correspond to the positions of dotted lines numbers 1 and 4 in the diagram of FIG. 6. The electromagnetic power Pem is thus proportional to motor torque at these instants when phase current in one phase and its derivative is zero, and the derivative of the phase current in one of the other two phases is also zero. Pem may therefore be calculated very simply, based on measurements of phase current and phase voltage taken at these instants, and electromagnetic torque Tem may also be simply calculated, from a rotational speed measurement taken at the same instant and the calculated value of Pem.

Figure 4B:
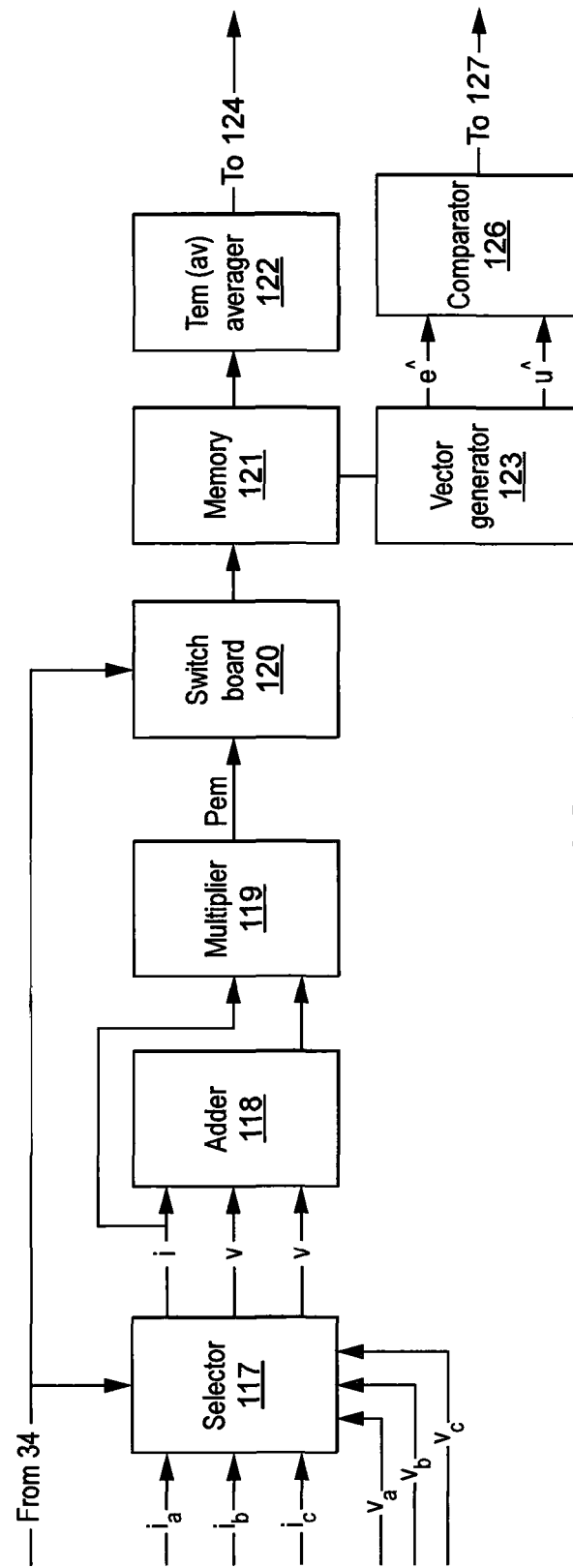
FIG. 4b is a schematic flow chart illustrating the calculation of instantaneous values of the EMF and electromagnetic motor torque.

The manner in which the motor's parameters are calculated from these instantaneous measurements is illustrated in FIGS. 4a and 4b. In FIG. 4b, there is illustrated a selector 117 which receives continuous measurements of each of the three phase currents ia, ib and ic from the three current measuring devices C1, C2 and C3. The selector 117 also receives continuous measurements of each of the three phase voltages va, vb and vc from the three voltage measuring devices V4, V5 and V6. The selector may further include a processor which can provide continuous measurements of the derivatives dia/dt, dib/dt and dic/dt of the three phase currents ia, ib and ic by, for example, calculating the differences between pairs of successive sampled values of phase current and dividing it by the time interval between samples.

The selector 117 may continuously monitor the three phase currents ia, ib and ic, and the derivatives of the three phase currents with time, and detect the condition in which one of the phase currents and its derivative are zero, and the derivative of another one of the phase currents is zero, and for that instant provide to the adder 118 measurements of the phase voltage of the phase whose current is zero, and measurements of the phase voltage and phase current of the phase whose phase current derivative is zero.

Alternatively, the selector 117 may receive a control signal from the master controller 34 at a particular point in the cycle, which may correspond to one of the lines 1 to 6 of FIG. 6, and at that instant the selector 117 may determine, on the basis of the values of the phase currents and the derivatives of the phase currents, whether the condition exists that one of the phase currents and its derivative are zero, and the derivative of another one of the phase currents is zero, and if the condition exists then the selector 117 may provide to the adder 118 measurements of the phase voltage of the phase whose current is zero, and measurements of the phase voltage and phase current of the phase whose phase current derivative is zero.

In either case, an instant at which one of the three phase currents and its derivative are both zero, and the derivative of one of the other phase currents is zero, then the selector passes to an adder 118 the instantaneous values of:
the phase voltage in the zero-current phase;
the phase voltage in the phase whose phase current derivative is zero; and
the instantaneous value of the phase current in the phase whose current derivative is zero.

The value of the phase current in the phase whose current derivative is zero is also passed to a multiplier 119, to complete the computation of Pem using the result computed by the adder 118.

For example, when the selector 117 detects that:
the phase current ia in phase a is zero; and
the derivative dia/dt of the phase current in phase a is a zero; and
the derivative dib/dt of the phase current in phase b is zero,
which situation occurs, for example when phase a is at the instant in the cycle illustrated by dotted line 1 in FIG. 6 and consequently phase b is that the position indicated by dotted line 3 in FIG. 6, then the selector passes to the adder 118 the instantaneous values of:
the phase voltage va in phase a,
the phase voltage vb in phase b, and
the phase current ib in phase b.

The adder 118 can then calculate values for ea and eb using the relevant two of the three equations 5a, 5b and 5c, depending on which values are passed to the adder 118 from the selector 117. In the example of the previous paragraph, the selector passes the values va, vb and ib, and the adder uses equations 5a and 5b.

In equation 5a, the terms r1ia and L1dia/dt are both zero because ia and dia/dt are both zero, and thus equation 5a becomes $$ea = va.$$

Similarly, in equation 5b the final term is zero because dib/dt is zero and thus equation 5b becomes $$eb = vb - r1ib$$

The electromagnetic power Pem may thus be easily computed by substituting these values into equation 4, Since the phase current ia in phase a is zero, the first term on the right-hand side of equation 4 goes to zero, and equation 4 simplifies to:

$$Pem = (2eb + ea)ib$$

Thus, substituting for eb and ea, equation 4 becomes:

$$Pem = (2(vb - r1ib) + va)ib$$

and as r1 is a known characteristic of the motor (the resistance of the stator), then Pem may be easily calculated by substituting the values of r1, vb, va and ib. By dividing the value for power Pem by the rotational speed measured at the same instant, a value of electromagnetic torque Tem at that instant is obtained. The value of r1 may, for example, be stored in a memory and retrieved to perform the calculation of Pem.

FIG. 4a illustrates the adder 118 and multiplier 119 which form part of the processor 9. In the example illustrated in FIG. 4a (which differs from the above example because the simultaneous measurements are taken when phase b is at the point in the cycle corresponding to dotted line 1 in FIG. 6, and phase a is at the point corresponding to dotted line 5 in FIG. 6), the selector 117 has determined that:
the current ib in phase b is zero;
the derivative dib/dt is also zero; and
the derivative dia/dt of the phase current ia in phase a is zero;
and has passed to the adder 18 the simultaneous values of:
the phase current ia in phase a;
the voltage va in phase a; and
the voltage vb in phase b.

Equations 5a and 5b are again used, and when the zero terms are removed they simplify to:

$$ea = va - r1ia$$

$$eb = vb$$

The electromagnetic power Pem may again be easily computed by substituting these values into equation 4, Since the phase current ib in phase b is zero, the second term on the right-hand side of equation 4 goes to zero, and equation 4 simplifies to:

$$Pem = (2ea + eb)ia$$

Thus, substituting for eb and ea, equation 4 becomes:

$$Pem = (2(va - r1ia) + vb)ia$$

By substituting these three values of ia, va and vb in equations 6a and 6b, the adder 118 calculates values for ea and eb, and then the sum "(2ea+eb)" and passes it to the multiplier 119. The instantaneous current value ia is also passed to the multiplier 119, which forms the product "(2ea+eb).ia" which, as described above is a measure of the electromagnetic power Pem.

If instantaneous measurements are taken when the current in phase c and its derivative is zero (i.e. when phase c is at the position of broken line 1 in FIG. 6), then the current in phase a will be at the position of broken line 3 and that in phase b will be at the position of broken line 5. Thus the phase current in phase c will be zero, the derivative of the phase current in phase c will be zero, and the derivatives of the phase currents in both phases a and b will be zero. The calculation of electromagnetic power Pem may then be performed on the basis of equation 5c and one of equations 5a and 5b, in a manner similar to that described above. The calculation is thus simplified and the processing requirements for calculating the electromagnetic power at these instants is reduced.

In the case where the current is zero and the derivative of the current is zero in phase a, and the derivative of the current is zero in phase c, the equations for EMF and electromagnetic power are as follows:

$$ec = vc - r1ic \tag{7a}$$

$$ea = va \tag{7b}$$

and $$Pem = (2ec + ea)ic \tag{7c}$$

When the selector 117 detects the occurrence of zero current and zero current derivative in phase a, and zero current derivative in phase c, then the selector 117 will provide to the adder 118 instantaneous values for the phase voltage vc and phase current ic in phase c and the phase voltage va in phase a. The adder 118 and multiplier 119 will then use these values to calculate Pem.

The case where the phase current and its derivative are zero in phase b is discussed above.

In the case where the current is zero and the derivative of the current is zero in phase c, and the derivative of the phase current ib in phase b is zero, the equations for EMF and electromagnetic power are as follows:

$$eb = vb - r1ib \tag{8a}$$

$$ec = vc \tag{8b}$$

then $$Pem = (2eb + ec)ib \tag{8c}$$

When the selector 117 detects the occurrence of zero current and zero current derivative in phase c, and a zero current derivative in phase b, then the selector 117 will provide to the adder 118 instantaneous values for the phase voltage vb and phase current ib in phase b and the phase voltage vc in phase c.

Referring now to FIG. 4b, the selector 117, adder 118 and multiplier 119 operate to provide a number of values of Pem taken at intervals during each mains supply cycle, and these are provided to a switchboard 120. The switchboard 120 directs the calculated values of Pem and the angles of the current vector, the EMF and the voltage vector to a memory 121 where the values are sequentially stored. The memory 121 may store, for example, the last ten calculated values of Pem together with corresponding values of rotational speed measured at the same instant as the current and voltages from which each value of Pem was calculated. From each pair of corresponding values of Pem and rotation speed, a value for the electromagnetic torque Tem at that instant can be calculated, and a value of the relative electromagnetic torque T*em may be found by dividing this value of Tem by the ratio of the actual rotation speed n to the design rotation speed $n^o$.

Alternatively, the memory may store only the calculated values from the current and/or the last mains voltage cycle, or may store a larger number of values from previous mains cycles. In a further alternative, the memory 121 may store calculated values of electromagnetic torque Tem or T*em rather than corresponding pairs of values of electromagnetic power Pem and rotational speed.

An averager 122 then retrieves a number of the latest calculated values of Pem, Tem or T*em from the memory 121, and computes an average value T*em(av) for the electromagnetic torque generated by the motor from these retrieved values. The averager 122 may take values calculated during the current and/or previous mains cycle, or may take values from a number of previous mains cycles to calculate the average value. This average value T*em(av) is used in determining when the motor connections are to be switched from Star to Delta or back to Star, as will be explained below.

Vector Generator

The vector control is based on an analysis of the disposition of changes in the angles of voltage, EMF and current vectors (θu, θe, θi), which values are also retrieved from the memory 121 by a vector generator 123. The function of the vector generator 123 is to generate the vector values of the electromotive force ê in each phase winding and the mains supply voltage u. The angles between these vectors change during operation of the motor, depending on the given parameters of the motor, such as phase resistance of the stator and rotor windings, leakage reactance of the stator and rotor windings, and the magnetizing reactance.

Figure 5:
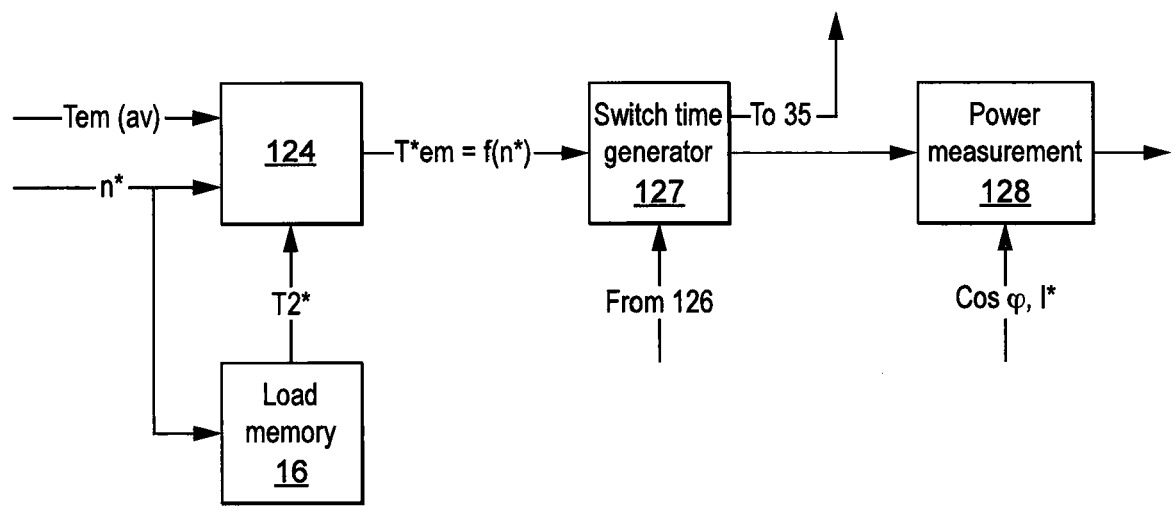
FIG. 5 is a schematic flow chart illustrating the calculation for generating signals of the motor control.

Outputs of vector generator 123 are sent to a comparator 126, and the result of the comparison controls the operation of a switch time generator 127 (FIG. 5).

The vector quantities ê are compared with the vector û in the comparator 126 to determine if the vectors are in phase, and this comparison is used to determine when a switching operation from Star to Delta or vice versa is to be initiated, and also when a dynamic braking mode must be entered. When the comparator 126 determines that the vectors are in phase, a signal is sent to the switch time generator 127 to start the process of switching between Star and Delta connections or to enter the dynamic braking mode. By precisely timing the switch between Star and Delta or the entry into dynamic braking mode, large inrush currents into the motor can be avoided.

Generating the Switching Command

Referring now to FIG. 5, the average of the electromagnetic torque value T*em(av) from the averager 122 is input into a processing unit 124. The processing unit 124 also receives an input indicative of the rotation speed n, or the relative speed n*, of the motor and load. The relative speed n* is the actual speed n of the motor divided by the nominal speed $n^o$ of the motor. This speed input may be derived from a tachometer measuring the rotation speed n of the motor shaft or of a part of the load, and the relative speed n* may be calculated from the measured speed n and the design speed $n^o$ of the motor. Alternatively, the relative speed n* may be derived from a calculation based on the nominal speed $n^o$ of the motor and the slip s of the motor.

The speed measurement is also input to the load data memory 16 in FIG. 5, in order to retrieve from the memory 16 the value of the relative static load torque T2* which corresponds to that relative rotation speed. The retrieved value of T2* is then input into the processing unit 124.

The processing unit 124 thus receives three input values, namely:
i. the measured average relative electromagnetic torque T*em(av);
ii. the rotation speed n*; and
iii. the relative torque T2*, which is a function of the relative speed n*and is a measure of the torque required to drive the load at that relative speed.

The processing unit 124 firstly determines whether the motor is currently connected in Star or Delta configuration, and then compares the relative average electromagnetic torque T*em(av) to a pre-stored threshold value, to determine whether or not the motor is to be switched to the other configuration. The threshold value may be stored in the processing unit 124, or may be stored in the motor data memory 15 and retrieved therefrom as required. Two threshold values may be stored, one value corresponding to operation in Star connection and one corresponding to operation in Delta connection. The two threshold values may be the same, or may be different. The basis for the comparison may also differ between the Star and Delta connection. When the motor is operating in Star configuration, a decision to switch to Delta configuration may be made when the relative average electromagnetic torque T*em(av) is equal to or greater than the pre-stored threshold value for Star operation. When the motor is operating in Delta configurations, a decision to switch to Star configuration may be made when the relative average electromagnetic torque T*em(av) is equal to or less than the pre-stored threshold value for Delta operation.

If it is determined that the motor should be switched to the other configuration, then the value T2*for the torque requirement of the load at the current rotation speed is retrieved from the load data memory 16, and a comparison is made to determine whether the relative average electromagnetic torque T*em(av) is equal or close to the current torque requirement of the load.

If it is determined that the relevant threshold value for T*em(av) has been reached or passed, and the relative average electromagnetic torque T*em(av) is equal or close to (for example within 5% or 10% of) the current torque requirement of the load, then a command is sent to the switch time generator 127 indicating that the motor should be switched to the other configuration.

When the switch time generator 127 receives a switching command from the processing unit 124, the switch time generator 127 compares the phase angles between phase EMF and mains voltage, and when these phases are aligned sends signals to the master controller 34 to initiate the switching from Star to Delta or Delta to Star.

The master controller 34 in FIG. 3 is arranged to send control signals to the thyristor controller 35 to switch the thyristors Th1 to Th9 so as to connect the windings of the motor 1 in either the Star or Delta configuration in response to predetermined drive conditions, in order to reduce the energy consumed by the motor. Unlike previous methods of switching the motor windings, in the present embodiment switching from Star to Delta or vice versa is done on the basis of a value of the motor's electromagnetic torque (Tem), the rotational frequency (n) and the static load on the motor shaft. In this way, the energy-saving effect of switching is maximised in an electric drive with a variable load.

The precise timing of each switch from Star to Delta is made on the basis of a comparison between the vector values of the phase EMF of the motor and the mains supply phase voltage, switching being effected when these two vector quantities are in phase, i.e. their phase angles are aligned.

Storing Load Characteristic Data

Characteristics of the load, such as the relationship between static load torque T2 and rotation speed n for the load, are stored in the load data memory 16 seen in FIGS. 2 and 5. The data may be stored in the form of a look-up table, the table including a number of values of rotational speed between zero and the maximum design speed of the motor, with a respective value of the torque T2 required by the load at that speed recorded for each speed. Alternatively, the lookup table may have relative values of static load torque T*2, i.e. the ratio of the torque T2 actually required at a particular speed to the torque T°2 required to drive the load at the motor's nominal speed. Likewise, rather than values of the actual rotation speed n, the lookup table may include values of the relative speed n* of the motor which is the ratio of the measured speed n to the nominal design speed n° of the motor. This characteristic data may be input into the load data memory by any convenient means, for example wirelessly via antenna 19, by inserting a memory stick into a socket, by inserting a flash memory or disc into an appropriate drive (not shown), or by connecting a cable to the port 20 of the input/output unit 18.

Figure 7:
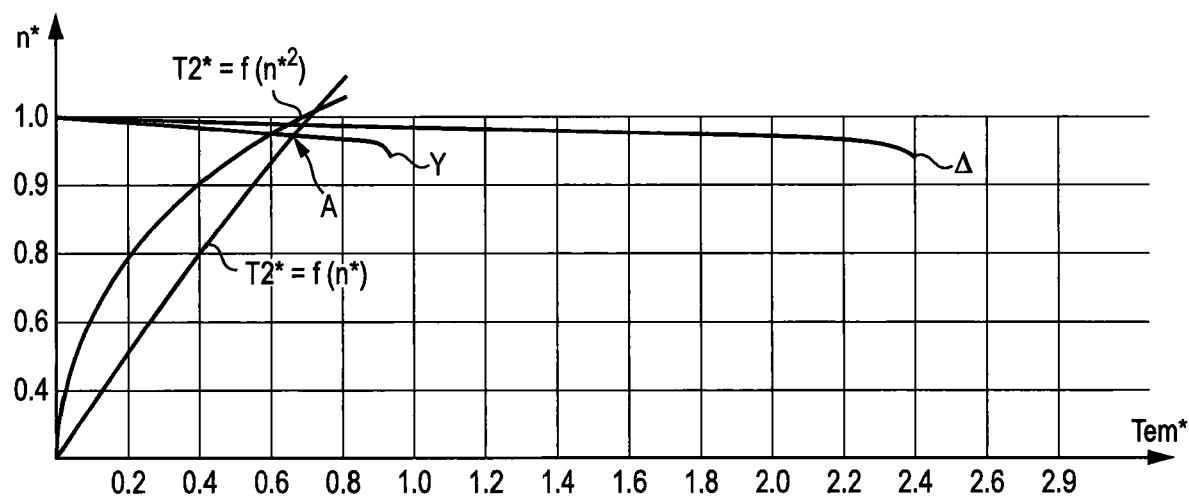
FIG. 7 is a diagram showing exemplary relationships between electromagnetic torque and motor rotation speed for a motor in the "Y" and "Δ" configurations, and exemplary relationships between static load torque T2 and rotation speed for two different loads.

Examples of the characteristic data for a load expressed in two different ways are seen in FIG. 7. The straight line labelled T2*=f(n*) shows a linear relationship between the relative static load torque and the relative speed, which may apply, for example, to an escalator. The curved line labelled T2*=f(n*$^2$) shows a non-linear relationship between the relative static load torque T*2 of the load and the square of the relative rotation speed n* of the load, which is a representative curve for a load such as a fan. Both characteristics illustrate the relationship between the rotational speed of the load and the amount of torque required to drive the load at that speed.

The load data memory 16 may also store parameters of the load such as its moment of inertia, maximum and minimum acceleration and deceleration rates permissible for the load, or other parameters particular to the load. For example, if the motor is driving an escalator then a maximum acceleration parameter may be stored to avoid passengers from falling.

Storing Motor Characteristic Data

The mechanical characteristics of the motor, such as the relationship between electromagnetic torque Tem and motor speed n for both Star and Delta connections are stored in the motor data memory 15 of FIG. 2.

The data may be stored in the form of look-up tables, the table including a number of values of rotational speed n between zero and the maximum design speed of the motor, with a respective value of the electromagnetic torque Tem produced by the motor at that speed in both Star and Delta connection recorded for each speed. This characteristic data may be input into the load data memory wirelessly or by connecting a cable to the port 20 of the input/output unit 18. Additionally, the motor data memory may store, for different values of speed n, values of relative electromagnetic torque T*em, i.e. the ratio of the torque Tem actually produced in both Star and Delta connection, and the nominal values of the electromagnetic torque T°em for the motor. Likewise, the lookup table may correlate the stored values of electromagnetic torque Tem with values of the relative speed n* of the motor rather than values of the actual rotation speed n. The motor data memory may also store the nominal values of motor speed n° and electromagnetic torque T°em for the motor, as well as other motor parameters such as the design supply voltage and power output.

The lines marked Y and Δ in FIG. 7 illustrate the characteristic relationships between the relative electromagnetic torque T*em of the motor and the relative speed n* of the motor (the actual speed n divided by the nominal speed n°). The line marked Y represents the relationship when the motor is connected in Star configuration, while the line marked Δ represents the relationship when the motor is connected in Delta configuration. The area of sustainable values of these mechanical characteristics of the motor, i.e. the combinations of values at which the motor can stably run, is determined by the motor parameters which are normally provided by the manufacturer, in accordance with the following well-known relationship:

$$T^*em = 2T^*cr/(s/sc + sc/s)$$

where
T*em=current value of the electromagnetic torque of the asynchronous motor with respect to the nominal;
T*cr=critical electromagnetic torque of an asynchronous motor with respect to the nominal;
s=the current value of the slip of the asynchronous motor; and
sc=critical slip value for the particular type of motor.

The motor data memory may also store values specific to a particular motor such as the critical value sc of slip for the motor, the critical electromagnetic torque value Tcr for the motor, or the relative critical electromagnetic torque value T*cr for the motor.

The motor data memory may also store a threshold value of electromagnetic torque Tem for switching the motor between the Star and Delta configurations. The threshold value may be such that when the electromagnetic torque is at or above the threshold value, the motor is connected in Delta mode and when the electromagnetic torque is below the threshold value, the motor is connected in Star mode. The motor data memory may store two threshold values, one threshold value corresponding to a switch from Star to Delta, and the other threshold value corresponding to a switch from Delta to Star. The two threshold values may be the same. The threshold value for switching from Star to Delta may be higher than the threshold value for switching from Delta to Star.

The characteristic data stored in the load data memory and the motor data memory may alternatively be stored as an algorithm, so that by inputting a value of the speed n or the relative speed n*, the corresponding value of the load static torque T2 or T2*, or the electromagnetic torque Tem or T*em may be retrieved.

Starting and Driving

Figure 8:
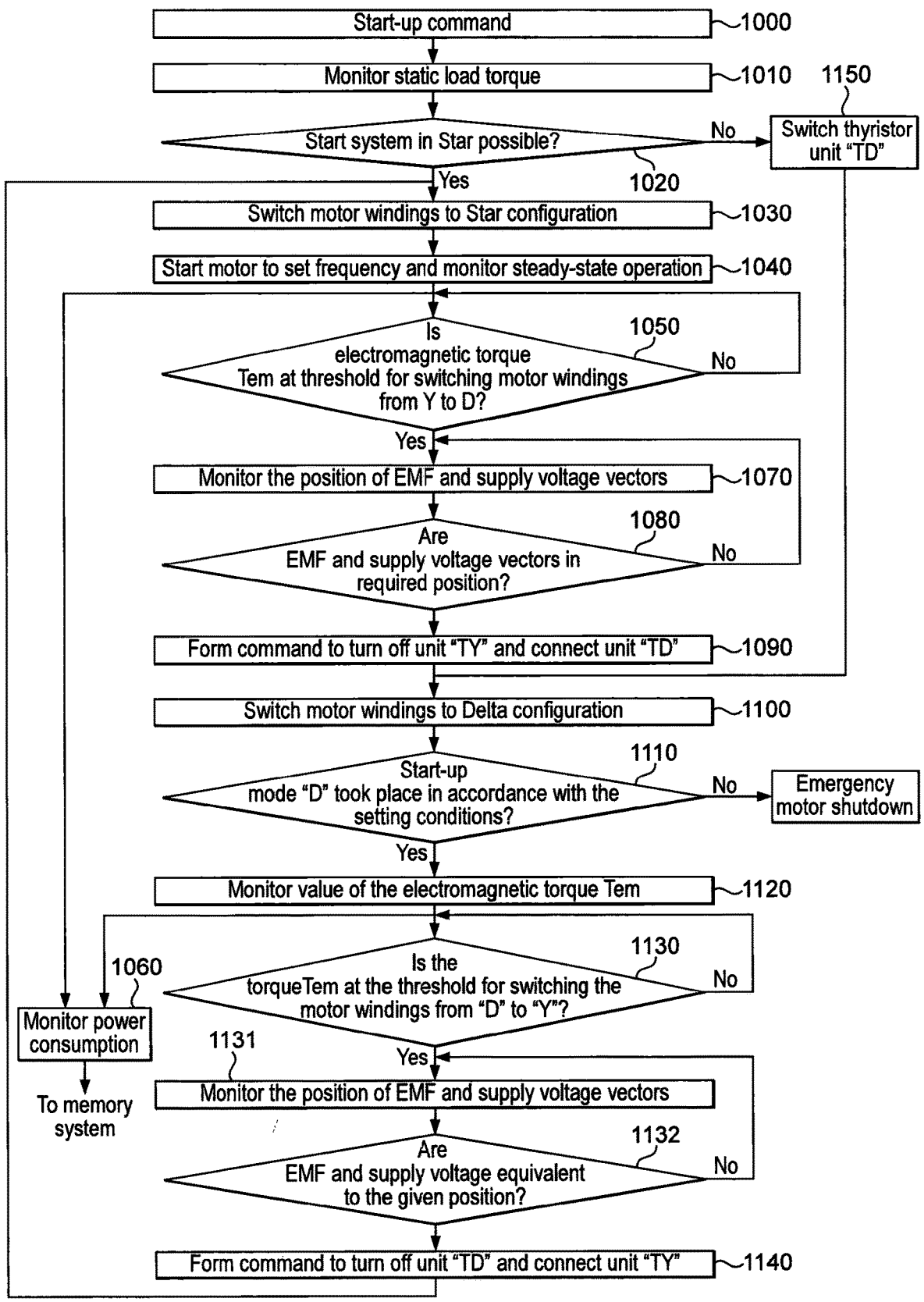
FIG. 8 is a flowchart illustrating the operation of the control unit in the startup and steady state modes of the motor.

FIG. 8 illustrates a high level flow chart of an exemplary embodiment of the operation of the control unit in the startup and steady state modes of the motor. This Figure explains in more detail the control algorithm of an asynchronous motor, which may be implemented in hardware, in software, or in a mixture of hardware and software in an apparatus operating in accordance with the method of the present invention. Prior to starting the motor, the thyristors Th1 to Th9 are all open, i.e. non-conducting.

Referring now to FIG. 8, in stage 1000 the command to start the motor is given, for example by a manual input from a machine operator.

Next, in stage 1010, the load data memory is interrogated to retrieve the values of torque T2 required by the load in the starting period as the load accelerates to design speed, and the motor data memory is interrogated to retrieve the nominal value of the electromagnetic torque T°em.

Next, in stage 1020 the control system determines on the basis of this retrieved data whether the motor start can be started in Star configuration. If at the beginning of the starting period the torque required by the load does not exceed a first particular fraction (in this example about 0.4) of the nominal value of the electromagnetic torque T°em, and at the end of the acceleration does not exceed a second particular fraction (in this example about 0.6) of the value of T°em, then it is determined that a start-up in Star configuration is possible, and the processing passes to stage 1030 and the motor is started in the Star configuration.

If the values of torque required by the load exceed the first and second particular fractions (about 0.4 and 0.6 T°em respectively) at the beginning and end of the start-up phase, then a start-up in the Star configuration is not possible and processing passes to stage 1100 where a command is given to switch on the six thyristors of thyristor unit TD, to switch the motor windings to Delta configuration. Processing then passes to stage 1100 and the motor startup is performed in the Delta mode in accordance with amplitude-phase control.

It is emphasised that the values of about 0.4 and 0.6 T°em are exemplary values only, and the values of T°em used in any particular application of the invention to decide whether a start-up in Star configuration is possible may be higher or lower than these exemplary values.

If it is determined in stage 1020 that the motor can be started in Star configuration, in the stage 1030 the three thyristors Th7 to Th9 of thyristor unit "TY" are switched on to connect the motor windings in Star configuration.

In stage 1040 the motor is started in a Star mode and the motor and load are accelerated up to a rotation speed corresponding to the point of intersection of the mechanical characteristic of the motor in the Star mode (T*em=f(n*)) with the characteristic of the static load torque (T2*=f(n*), as indicated by arrow A in FIG. 7.

While the motor is operating in its steady state mode, in stage 1040 changes in the electromagnetic torque Tem as a function of rotation speed in the steady state operation mode are monitored, and in the event that the electromagnetic torque Tem reaches or rises above a predetermined threshold value (in this example set at approximately 0.6 T°em), then in stage 1050 it is determined that the motor windings should be switched from Star to Delta configuration. This will be done by turning off the thyristors Th7 to Th9 of thyristor unit "TY" and switching on the thyristors Th1 to Th6 of thyristor unit "TD".

It is again emphasised that the value of 0.6 T°em is quoted merely as an example, and the threshold value at which the control system determines that the winding should be switched from Star to Delta may be higher or lower than this value.

At the same time in the stage 1060 values of power consumed by the motor are generated, and are stored in memory for reasons to be described later.

After receiving the command from the stage 1050 for switching the motor windings from Star to Delta, in stage 1070 the position of the motor EMF and the supply voltage vectors are monitored, and in stage 1080 it is determined whether the EMF and supply voltage vectors are in the required positions for switching.

Once the EMF and supply voltage vectors are coincident, the command is given in stage 1090 to sequentially turn off the thyristors of thyristor group "TY" and then sequentially switch on the thyristors of thyristor group "TD" in the manner described below in the section entitled "The Switching Operation". This provides a reconnection of the motor winding from Star to Delta.

Switching to Delta configuration is monitored in stage 1100 and the required conditions for operating in Delta mode are checked in stage 1110. If the switch to Delta was made in a normal mode, and after a predetermined interval the motor is operating in a steady state according to characteristics T*em=f(n*) and T2*=f(n*), as shown in FIG. 7, then operation of the motor continues.

In stage 1120 the value of T*em is continuously monitored in accordance with the mechanical characteristics of the motor in Delta mode, and in stage 1130, it is determined whether the value of T*em reaches the threshold value for switching the windings from Delta to Star. In this example, the threshold occurs when T*em is approximately 0.7 to 0.8 of T°em).

It is again emphasised that the value of 0.7 to 0.8 T°em is quoted merely as an example, and the threshold value at which the control system determines that the winding should be switched from Delta to Star may be higher or lower than this value.

If the threshold is reached, then in stage 1131 the position of the motor EMF and the supply voltage vectors are monitored, as described in relation to step 1070, and in stage 1132 it is determined whether the EMF and supply voltage vectors are in the required positions for switching.

Once the EMF and supply voltage vectors coincident, the command is given in stage 1140 to sequentially turn off the thyristors of thyristor group "TD" and then sequentially switch on the thyristors of thyristor group "TY" in the manner described. This provides a reconnection of the motor winding from Delta to Star.

After this command is received from stage 11140, the thyristor groups are switched from "TD" to "TY" as described above and the processing returns to stage 1030.

During the motor operation in Delta mode, similarly to during its operation in Star mode, there is carried out continuous monitoring of the power consumed by the motor (stage 1060) with the transfer of monitored values to memory.

If in stage 1110 it is found that within a specified time the switching of the motor from Star mode to Delta mode has not happened, or the motor is not operating in correct steady-state conditions, the command is given for the emergency shutdown of the motor from the mains.

The Switching Operation

After determining the advisability of switching the motor windings according to terms of energy saving, the control system compares a motor self-induction EMF with the voltage supplied to the motor, and starts the process of switching connections of the motor windings from Delta to Star or vice versa.

When the load on the motor shaft has reduced to a predetermined threshold value, a command to change from Delta to Star connection is given, and the process of opening the thyristor switches begins. The actual opening of the thyristor switches occurs sequentially, the switches of one phase being opened first when the current in that phase passes through zero (currents in the other two phases at that moment are equal in amplitude but opposite in sign). Then, as the current passes through zero in the remaining two phases, the thyristor switches for those two phases are sequentially opened. During the dead time when the thyristor switches are all open, the EMF induced in the motor stator circuits between two phases is monitored, and when this EMF is equal to the supply voltage the control circuit gives the command to close the three thyristor switches to connect the windings in the Star configuration, when the network's supply voltage vector and those of the motor's EMF match in phase.

In a similar fashion, the control system switches the motor windings from Star to Delta when the load increases beyond a predetermined threshold value. The thyristor switches of the Star connection are sequentially opened as the current in each phase passes through zero until all three switches are open. The EMF induced in the motor stator circuits between two phases is monitored, and when this EMF is equal to the supply voltage the control circuit closes the thyristor switches to connect the windings in the Delta configurations as the network's supply voltage vectors and those of the motor's EMF match in phase.

There may only be 2 or 3 instants during each revolution of the motor when the phase angle between the EMF and the mains voltage is suitable for initiating the switching operation between Star and Delta connections. The inertia of the motor/load combination is a factor in determining the number of instants in each mains cycle that the switching operation can be initiated.

Due to the fact that the EMF amplitude is less than the amplitude of the mains supply voltage, switching to reconnect the windings to the supply in either of the above cases starts immediately after the minimum dead time necessary for preventing a short circuit as the value of phase EMF passes through zero.

By disconnecting each phase when the current in that phase is zero, and reconnecting each phase when the induced EMF coincides with the supply voltage, the generation of inrush currents into the motor when switching between Star and Delta connections is avoided.

Braking Mode

In contrast to the motor's startup modes and steady mode operation mode, the braking modes of the asynchronous motor are more burdensome. Processes, running under the sustained magnetic field, cause even stronger torque surges, than at the startup. It is known that in this case the process is unstable and depends on the displacement angle between the EMF, induced by the rotor currents in the stator windings, and the supply voltage. Thus there are both favorable and unfavorable displacement angles.

The present proposal uses, in the motor braking mode, the same principle of comparison of EMF motor and supply voltage vectors which is adopted in the steady state mode to reduce the inrush current when switching windings from Delta to Star.

In the present proposal, the switching of the motor from driving operation to the braking mode is performed at instants when the network's voltage vectors and those of the motor's EMF match in phase. Under such control, the motor braking mode produces a substantial braking torque that decelerates the motor and prevents it from "hanging" in the high frequency rotation area.

The closeness of the matching between these vectors before the application of the next control pulse is dependent on the inertia of the drive. For drives having a higher inertia, a closer matching of the vectors should be achieved before the start of braking.

An essential feature of this proposal is that at the time when the control system receives an external command to start forced braking, the control system switches off a particular group of thyristors.

Thus, if the motor is operating in the Delta mode, the three pairs of thyristors of the thyristor unit "TD" are all turned off, and at an instant when the voltage vector and motor EMF are in phase, then one thyristor of each pair is switched on. This allows a DC current to flow through the motor windings which forms a fixed space in the field.

If there is a need of braking when the motor is in the Star configuration, it is sufficient to turn off the three thyristors from the thyristor unit "TY", and then switch one of them back on at the instant when the voltage vector and motor EMF are in phase, as shown in FIG. 10 described below.

Figure 9:
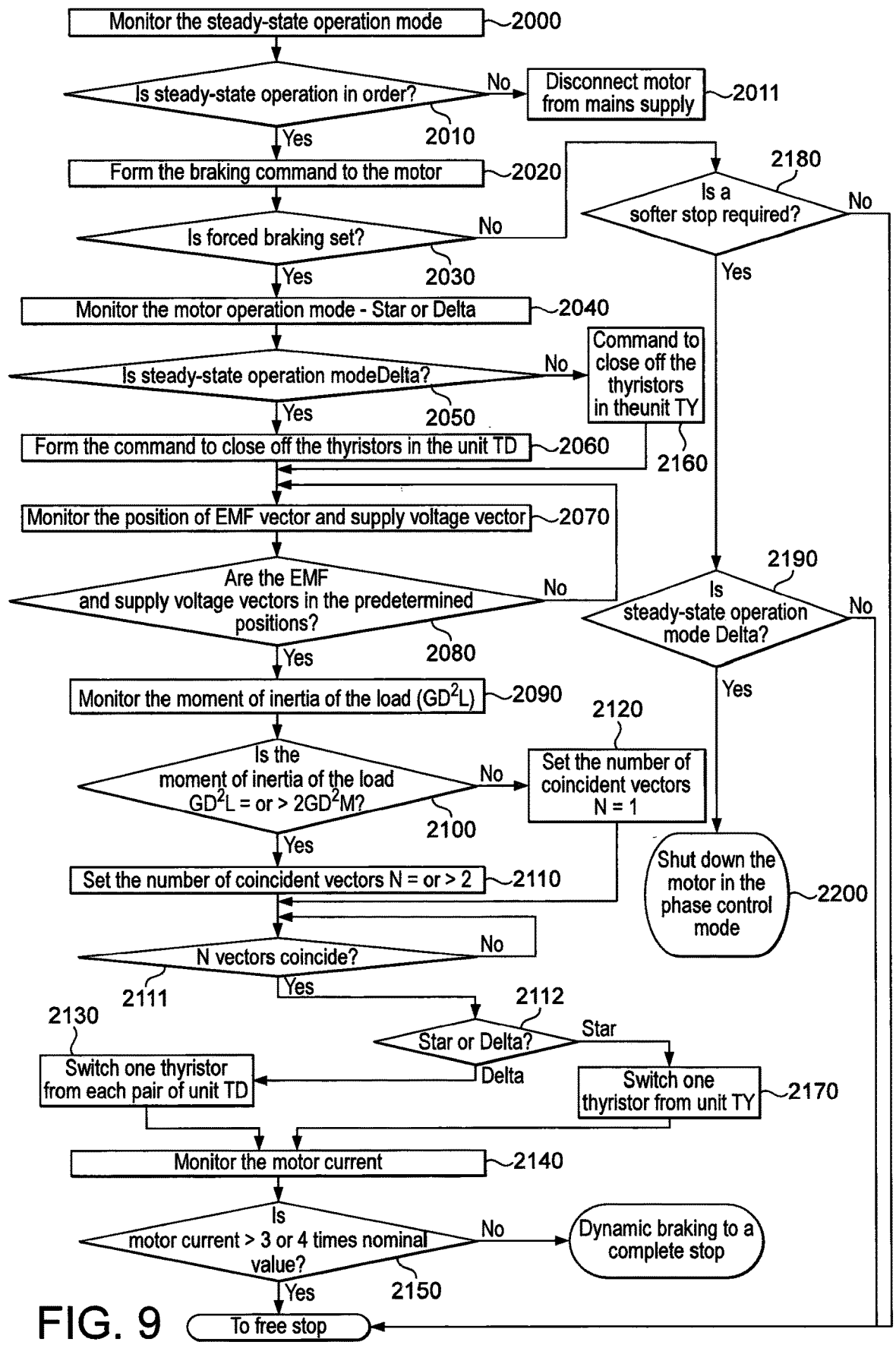
FIG. 9 is a flowchart illustrating the operation of the control unit in the braking modes.

FIG. 9 is a flow chart of an exemplary method of the operation of the controller in the braking modes. This Figure explains in more detail the control algorithm for the braking modes of the asynchronous motor, to be implemented in the apparatus in accordance with the method proposed in the present invention.

In stage 2000 the motor is in steady state operation, and monitoring of the operation of the motor is performed, measuring the current and voltage parameters as described before. In stage 2010, if the monitored parameters of the motor differ from their required values, for example in the case of an overload, then if necessary a planned braking mode may be required. If there is any deviation from the nominal steady-state, and the planned braking can't be performed, then the motor must be switched off from the mains at stage 2011.

If motor operation is in order and braking is required, then a command for braking is input at stage 2020. The braking command may be for forced braking, or may be simply a command to disconnect the motor from the mains supply and allow it to come to a free stop.

In stage 2030 the control unit determines whether forced braking to stop the motor is required. If so, in step 2040 the control unit determines whether the motor is running in Star or Delta mode.

If it is operating in Delta mode, then the processing flows to stage 2060, and all of the three pairs of thyristors in thyristor unit "TD" are turned off.

At the same time in stage 2070 the positions of the phase EMF and supply voltage vectors are monitored and their phase angles compared. If these vectors are in predetermined relative positions, which is verified in stage 2080, then in stage 2090 the predetermined moment of inertia of the load is determined, for example by retrieving moment of inertia data from the load data memory, or by measurement.

If the moment of inertia of the load is equal to or more than twice the moment of inertia of the motor, which may be retrieved from the motor data memory, for example, then the stage 2100 sends to stage 2110 a requirement that the number of the phase EMF and supply voltage vectors which must coincide is equal to or more than two (N≥2). If the moment of inertia of the load is less than twice the moment of inertia of the motor, then at the stage 2120 the number of coincident vectors required is set at N=1.

In step 2111 it is determined whether the required number of vectors coincide, by comparing the number of coincident vectors with the set requirement N. When the required number of vectors is coincident, then in stage 2112 is determined whether the motor was running in Star of Delta configuration, and if the motor was running in Delta configuration the processing passes to stage 2130 and one thyristor from each pair of thyristors in the thyristor unit "TD", for example thyristors Th1, Th3 and Th5, is turned on.

In stage 2140 the phase motor currents ia, ib, ic during the braking mode are monitored. In stage 2150 the monitored phase motor currents are compared with the nominal value of the phase motor current, and if one of the phase motor currents ia, ib, ic is more than about 3 to 4 times the nominal current, then the motor is switched off from the supply network and goes to the free stop.

If none of the phase motor currents ia, ib, ic is more than about 3 to 4 times the nominal current, then the motor continues to be in the mode of dynamic braking to a complete stop.

If in stage 2050 the control system determines that the motor is operating in Star configuration, then processing moves to stage 2160 and all three of the thyristors in thyristor unit "TY" are closed. The vector positions are monitored as before through the stages 2070, 2080, 2090 and 2100, and in stages 2110 and 2120 the required number N of coincident vectors is set. When the required number of vectors coincide, then at stage 2112 it is determined that the motor was running in Star configuration, and processing passes to stage 2170 for connection of one of the thyristors from unit "TY", for example, thyristor Th9. Processing then passes to stage 2140 and continues as before until the motor stops.

If it is determined in stage 2030 that the braking command input does not require forced braking, then processing moves to stage 2180 where the need to increase the deceleration time, i.e. make a softer stop compared to the a free stop when the motor is disconnected from the mains supply, is determined from the braking command input. If a softer stop is not required, the motor switches to free stop. If a softer braking is required then processing moves to stage 2190 where it is determined whether the motor is operating in Star or Delta configuration. If the motor operates in Delta, then processing moves to stage 2200 and a command to stop the motor at a predetermined rate through the amplitude-phase control similar to the soft start is generated. If the motor was operating in Star configuration before the braking command was given, then the motor is simply turned off in the free stop mode.

Computer-readable instructions for carrying out the methods described in relation to FIGS. 8 and 9 may be stored in the control program memory 14 of the control unit, for execution by the processor 9. The instructions may be loaded into the control program memory 14 via the external port 20 or the antenna 19 of the input/output unit 18 of the control system 6.

In an installation mode, the control programs and motor data and load data may all be input to the respective memories 14, 15 and 16 of the control unit 6. At subsequent occasions, for example when the load driven by the motor is modified, or the motor is used to drive a different load, then load data characteristics for the modified or new load may be uploaded to the load data memory for use in determining when the motor should be switched from Star to Delta. Likewise, switching thresholds at which the motor connections are changed may be input into the control program memory after the system has been operating for a trial period, in order to maximise energy saving.

In a particularly advantageous embodiment, while the motor is operated, with the motor windings being switched between Star and Delta as necessary to ensure the most efficient operation of the motor, the power consumed (Pc) by the motor is measured in a power monitoring module 128 and recorded in memory (not shown).

Data indicating the power consumption of the motor may be collected over a period of time. This power consumption data may be compared to historic values of power consumed by the motor and a measure of the amount of additional power saved by the use of the system according to the invention can be arrived at. Such data may be transmitted or otherwise output from the control unit, for remote monitoring. It is foreseen that in some embodiments the control unit 6 may be remotely controllable to enable, vary or disable its operation by means of signals input to the input/output unit 18. For example, if the power saving features of the present invention are not required, a command to the motor control unit 6 via the antenna 19 or the input port 20 may be sufficient to cause the processor 9 to operate the thyristor drivers 10 to place the thyristors 8 in the condition where the motor 1 is simply connected in either Star or Delta configuration and operates permanently in that mode. A further command may be sent to the motor control unit 6 to reactivate the control unit so that the motor is operated in the energy-saving mode, switching from Star to Delta as required.

The invention claimed is:

1. A method/a controller for controlling an operation of a three-phase motor driving a load, wherein the motor is operable in both Star and Delta configurations, comprising:
   monitoring an electromagnetic torque produced by the motor;
   monitoring a rotation speed of the motor;
   comparing the electromagnetic torque produced by the motor to a threshold value, and
   switching the motor from Star to Delta or from Delta to Star configuration on a basis of that comparison;
   wherein the electromagnetic torque produced by the motor is monitored by:
   monitoring the rotation speed of the motor;
   monitoring phase currents in the three phases of the motor;
   monitoring derivatives of the phase currents in the three phases of the motor;
   monitoring phase voltages in the three phases of the motor;
   determining an instant at which the phase current and its derivative are both zero in one phase, and the derivative of the phase current is zero in a second phase;
   measuring the values, at that instant, of:
   a. the phase voltage in the one phase;
   b. the phase voltage in the second phase; and
   c. the phase current in the second phase,
   determining an electromagnetic power produced by the motor at that instant on the basis of the measured values; and
   calculating the electromagnetic torque produced by the motor at that instant on the basis of the determined value for electromagnetic power and the rotation speed.

2. A method according to claim 1, wherein the motor is switched from Star to Delta configuration when the value of the electromagnetic torque produced by the motor is equal to or greater than a first threshold value.

3. A method according to claim 1, wherein the motor is switched from Delta to Star configuration when the value of the electromagnetic torque produced by the motor is equal to or less than a second threshold value which is less than a first threshold value.

4. A method according to claim 1, wherein the motor is switched from Star to Delta configuration by:
   sequentially opening switches to disconnect each phase of an electric motor stator from a mains supply as the current in each phase of the stator passes through zero;
   monitoring electromotive force (EMF) induced in the phases of the motor stator and comparing the monitored values to a supply voltage vector; and
   closing switches to connect the motor phases in Delta connection when a network's supply voltage vectors and those of a motor's phase EMF match in phase.

5. A method according to claim 1, wherein the motor is switched from Delta to Star configuration by:

sequentially opening switches to disconnect each phase of a electric motor stator from a mains supply as the phase current in that phase of the stator is zero;

monitoring electromotive force (EMF) induced in the phases of the motor stator while the switches are all open and comparing the monitored values to a supply voltage vector; and closing switches to connect the motor phases in Star connection, when a network's supply voltage vector and those of a motor's phase EMF match in phase.

6. A method according to claim 1, further comprising:
comparing the electromagnetic torque produced by the motor with a torque requirement of the load, and
switching the motor from Star to Delta or from Delta to Star when the electromagnetic torque of the motor is substantially equal to the torque requirement of the load.

7. A controller for controlling an operation of a three-phase motor, comprising:
a phase current monitor for monitoring the respective phase currents in the three phases of the motor;
a phase voltage monitor for monitoring the respective phase voltages in the three phases of the motor;
a plurality of switches comprising a first group of switches operable when closed to connect the three-phase motor in Delta configuration and a second group of switches operable when closed to connect the three phase motor in Star configuration; and
processor circuitry operable to:
monitor a rotation speed of the motor;
monitor the phase currents in the three phases of the motor;
calculate and monitor derivatives of the phase currents in the three phases of the motor;
monitor the phase voltages in the three phases of the motor;
determine an instant at which the phase current and its derivative are both zero in one phase, and the derivative of the phase current is zero in a second phase;
measure values, at that instant, of:
  a. the phase voltage in the one phase;
  b. the phase voltage in the second phase; and
  c. the phase current in the second phase,
determine an electromagnetic power produced by the motor at that instant on a basis of the measured values; and
calculate an electromagnetic torque produced by the motor at that instant on a basis of the determined value for electromagnetic power and the rotation speed;
compare the electromagnetic torque produced by the motor to a threshold value, and
control the plurality of switches to switch the motor from Star to Delta or from Delta to Star configuration on the basis of that comparison.

8. A controller according to claim 7, further comprising a line voltage monitor for monitoring respective supply phase voltage vectors, and wherein the processor circuitry is further operable to control the plurality of switches to switch the motor from Star to Delta configuration by:
sequentially opening switches to disconnect each phase of an electric motor stator from a mains supply as the current in each phase of the stator passes through zero;
monitoring electromotive force (EMF) induced in the phases of the motor stator and comparing the monitored values to the supply voltage vector; and
closing switches to connect the motor phases in Delta connection when a network's supply voltage vectors and those of a motor's phase EMF match in phase.

9. A controller according to claim 7, further comprising a line voltage monitor for monitoring a respective supply phase voltage vectors, and wherein the processor circuitry is further operable to control the plurality of switches to switch the motor from Delta to Star configuration by:
sequentially opening switches to disconnect each phase of an electric motor stator from a mains supply as the phase current in that phase of the stator is zero;
monitoring electromotive force (EMF) induced in the phases of the motor stator while the switches are all open and comparing the monitored values to the supply voltage vector; and
closing switches to connect the motor phases in Star connection, when a network's supply voltage vector and those of a motor's phase EMF match in phase.

10. A controller according to claim 7, further comprising:
a comparator for comparing the electromagnetic torque produced by the motor with a torque requirement of a load, and
wherein the processor circuitry is operable to control the plurality of switches to switch the motor from Star to Delta or from Delta to Star configuration when the electromagnetic torque produced by the motor is substantially equal to the torque requirement of the load.

11. A method of driving a load by a three-phase electric motor supplied from a three-phase supply, wherein the three-phase electric motor may be switched from Star to Delta or from Delta to Star configuration, the method comprising:
monitoring an electromagnetic torque produced by the motor;
monitoring a rotation speed of the motor;
comparing the electromagnetic torque produced by the motor to a threshold value, and
switching the motor from Star to Delta or from Delta to Star configuration on a basis of that comparison;
wherein the electromagnetic torque produced by the motor is monitored by:
monitoring the rotation speed of the motor;
monitoring phase currents in the three phases of the motor;
monitoring derivatives of the phase currents in the three phases of the motor;
monitoring phase voltages in the three phases of the motor;
determining an instant at which the phase current and its derivative are both zero in one phase, and the derivative of the phase current is zero in a second phase;
measuring the values, at that instant, of:
  a. the phase voltage in the one phase;
  b. the phase voltage in the second phase; and
  c. the phase current in the second phase,
determining an electromagnetic power produced by the motor at that instant on the basis of the measured values; and
calculating the electromagnetic torque produced by the motor at that instant on the basis of the determined value for electromagnetic power and the rotation speed.

12. A non-transitory computer-readable medium including processor-implementable instructions which, when executed, cause a processor to implement the method recited in claim 1.

* * * * *